United States Patent [19]
Chu et al.

[11] Patent Number: 5,192,620
[45] Date of Patent: Mar. 9, 1993

[54] METALLIZED COMPOSITE FILM STRUCTURE AND METHOD

[75] Inventors: Shaw-Chang Chu, Cranbury, N.J.; James A. Johnson, Farmington, N.Y.

[73] Assignee: Mobil Oil Corporation, Fairfax, Va.

[21] Appl. No.: 789,560

[22] Filed: Nov. 8, 1991

[51] Int. Cl.⁵ .............................................. B32B 15/08
[52] U.S. Cl. .................................. 428/461; 428/354; 428/457; 428/910; 428/518; 427/404; 427/412.3; 427/171; 427/172; 427/322
[58] Field of Search .............. 428/461, 910, 518, 354, 428/457; 427/404, 412.3, 171, 172, 322

[56] References Cited

U.S. PATENT DOCUMENTS 4,345,005 8/1982 All et al. ............................ 428/461
4,946,720 8/1990 Oishi et al. .......................... 428/35.4

Primary Examiner—Paul J. Thibodeau
Assistant Examiner—Mark A. Forman
Attorney, Agent, or Firm—A. J. McKillop; C. J. Speciale; J. P. O'Sullivan, Sr.

[57] ABSTRACT

A metallized film combination of an oriented polymeric substrate layer having on one surface thereof a coating of a blend of (a) a vinyl alcohol homopolymer or copolymer and (b) an ethylene-acrylic acid copolymer, the coating blend having a metal layer thereon. The method involves coating the substrate after the substrate has been machine direction oriented and before the combination is transverse direction oriented followed by TD orientation and finally by depositing a metal layer on the blend surface.

8 Claims, No Drawings

METALLIZED COMPOSITE FILM STRUCTURE AND METHOD

BACKGROUND OF THE INVENTION

The invention relates to a multi-layer film structure having a metallized surface.

The bonding of metals, such as, aluminum, silver, chromium, etc., to plastic films has allowed such films to replace metallic foils in many instances. The flexibility of the films necessitates the formation of a strong metal-plastic bond, and a number of approaches have been developed for providing such bonding.

In U.S. Pat. No. 4,345,005, the disclosure of which is incorporated herein by reference in its entirety, a homopolymer polypropylene core layer is coextruded with an ethylene propylene copolymer. The film is biaxially oriented and the copolymer layer is corona discharge treated. Thereafter, a metal coating is deposited onto the corona discharge treated layer by any suitable process such as, vacuum deposition. In order to enhance adhesion between the metal and plastic film, neither the core layer or outer layer(s) contain a slip agent in an amount which would deleteriously affect the metal/polymer bond. The resulting product has utility in flexible packaging. Polypropylene film employed for packaging purposes inherently permits the transmission of oxygen and water vapor from the outside of the film to the inside of package made up of the film. Oxygen and water vapor promote rapid deterioration of foods packaged in such a container, therefore, its exclusion or control is desired.

It is an object of the present invention to present a metallized film and a method of forming the same which has a decreased oxygen transmission and water vapor transmission rate.

SUMMARY OF THE INVENTION

In accordance with the present invention, a metallized film combination comprises an oriented polymer substrate layer which in its unmodified form is susceptible of transmitting oxygen and moisture, at least one surface of which having a coating of a blend of (a) a vinyl alcohol homopolymer or copolymer and (b) an ethylene-acrylic acid copolymer; and said coating blend having a metal layer thereon.

The invention is also concerned with a method of forming a metallized film combination comprising (a) machine direction orienting a film substrate which is susceptible of transmitting oxygen and moisture, (b) applying to the MD oriented film a blend of a vinyl alcohol homopolymer or copolymer and an ethylene-acrylic acid copolymer, (c) stretching the film in the transverse (TD) direction; and (d) depositing on the surface of the blend a metal layer. Before the blend is applied to the MD oriented film it is preferred to corona discharge treat the substrate surface for improved surface wettability. In addition, after the coated film has been biaxially oriented it is preferred to corona discharge treat the coated surface preparatory to applying the metal to the surface.

DESCRIPTION OF PREFERRED EMBODIMENTS

The substrates contemplated herein include any polymeric film substrate which inherently permits the transmission of oxygen and water vapor and wherein the utility of such film would call for a minimization of such transmission. In most cases, the source of oxygen and water vapor referred to herein is atmospheric oxygen and water vapor. While nylon, polyethylene terephthalate, polycarbonate, etc. films are contemplated herein, the particularly preferred class of films are the polyolefins. Within the polyolefin class, homopolymers and copolymers of propylene are preferred. Particularly preferred are isotatic polypropylenes containing at least 80% by weight of isotatic polypropylene. The preferred base substrate layer can be a homopolypropylene having a melting point range of from about 321° to about 336° F. A commercially available material of this description is Exxon 4252 or Fina 3378. Copolymers of propylene with another alpha olefin, preferably ethylene can also be employed.

The vinyl alcohol polymers employed herein can be any commercially available material. For example, Vinol 125, 99.3 +% super hydrolized polyvinyl alcohol, or Vinol 325, 98% hydrolyzed polyvinyl alcohol obtained from Air Products Inc. The vinyl alcohol polymers include ethylene/vinyl alcohol copolymers obtained from any commercial source. For example, ethylene-vinyl alcohol copolymer (EVOH) is available under the name EVAL from Kura Ray Company, Ltd. of Japan. This material contains about 80% of vinyl alcohol.

The ethylene-acrylic acid copolymer is produced by the high pressure copolymerization of ethylene and acrylic acid. When ethylene is copolymerized with acrylic acid the molecular structure is significantly altered by the random inclusion of bulky carboxyl groups along the backbone and side chains of the copolymer. The carboxyl groups are free to form bonds and interact with any polar substrate; they can also hydrogen-bond together to yield toughness; and the carboxyl groups inhibit crystallization which results in clarity, lower melting and softening point. The ethylene-acrylic acid copolymers consists essentially of about 96 mole % methylene groups, thus, their water resistance is understandably similar to that of polyethylene. The ammonium salts of the copolymers permit water dispersions of the material to be formed which facilitates ease of topical application to surfaces. These copolymers can be formed having melt indexes ranging from about 300 to 3000. Commercially available examples of these copolymers are PRIMACOR 4983 (Dow Chemical Co.), an aqueous dispersion having 25% solids content and obtained from the reaction between approximately 20 wt % acrylic acid and 80 wt % ethylene; and Michem Prime 4983 available from Michelman Corporation.

The blend of (a) and (b) supra comprises about 10-90% by dry weight of the polyvinyl alcohol and about 90-10% by dry weight of the ethylene-acrylic acid copolymer. The blend of (a) and (b) supra may be further modified by additives and/or modifiers such as wax emulsions, colloidal silica dispersions, antiblocking agents, defoamers, and crosslinkers.

As indicated above, to obtain good adhesion between the metal film and the surface of the blend of the present invention, it is preferred to subject the surface to a corona discharge treatment. This is a conventional treatment and is carried out in a known manner to a dyne value of about 36-60 dynes/cm and preferably 40-50 dynes/cm.

The metal coating can be applied to the corona-treated blend-layer by any known method, such as, sputtering, vacuum deposition or electroplating. Vacuum deposition is a preferred method. The most frequently used coating metal is aluminum, although other metals such as gold, silver, chrome and copper are also contemplated.

In order to effectively inhibit the amount of oxygen transmitted through the base layer, the base layer must be coated with a barrier polymer such as a polyvinyl alcohol homopolymer or copolymer. However, polyvinyl alcohol has two drawbacks, (1) it adheres poorly to the preferred substrate layers unless the substrate is modified by a maleic anhydride grafted PP homopolymer or copolymer as a tie layer, and (2) it lacks good adhesion to the subsequently applied metal layer such as aluminum. It has been determined, however, if a blend of polyvinyl alcohol homopolymer or copolymer and an ethylene-acrylic acid copolymer is applied to the surface, a particularly aggressive bond is created. In addition, if this blend is applied after the substrate film has been machine direction oriented, then after the composite has been transverse direction oriented and a metal such as aluminum deposited on the surface, a uniquely ordered metal layer results.

In preparing the blend of the polyvinyl alcohol homopolymer or copolymer and the ethylene acrylic acid copolymer, the components ratio can range from 10:90 to 90:10 by dry weight. In preparing a roughly 50:50 blend in an aqueous dispersion for example 500 parts of a 10% solids, aqueous solution of Vinol 325 or 50 parts by dry weight of Vinol 325 (a 98% hydrolized medium viscosity polyvinyl alcohol, obtained from Air Products) can be mixed with 200 parts by weight of a 25% solids, aqueous dispersion of Michem 4983 or 50 parts by dry weight of Michem 4983 (an ethylene-acrylic acid copolymer obtained from Michelman, Inc.). This combination, adjusted to an aqueous 5% solids dispersion, will provide the polyvinyl alcohol to ethylene-acrylic acid comopolymer mixture in a dry weight ratio of approximately 50:50.

The following Examples illustrate the invention.

EXAMPLE 1

An aqueous coating dispersion of 5% solids was placed in a gravure coater which was located between the machine direction (MD) orienter and the transverse direction (TD) orienter of a film orienter. The aqueous coating is composed of 10 parts by dry weight of Vinol 325 and 90 parts by dry weight of Michem 4983. A polypropylene homopolymer (Exxon 4252) and an ethylene-propylene-butene-1 terpolymer skin resin containing 2000ppm of erucamide slip were coextruded at a weight ratio of 97/3 through a flat sheet die at 250° C., cast onto a cooling drum and quenched at 30° C. The terpolymer skin on one side of the film provided a heat-seal layer. The coextruded sheet, measuring about 30 mil thick, was reheated to 140° C. and stretched 5-fold MD and corona discharge treated on the homopolymer side for improved surface wettability. When passing through the gravure coater, the MD oriented film web, now about 6 mil thick, was coated on the homopolymer surface with the aqueous dispersion blend. The coated web was dried in pre-heat zones at 160° C., then stretched 8-fold TD and annealed at 160° C. The biaxially stretched film, measuring 0.8 mil, was corona discharge treated on the blend coated side before being wound into a film roll. The resultant coated film had a % haze of 1.6 and a gloss of 85.4.

EXAMPLE 2

In a manner similar to Example 1, an aqueous coating dispersion of 5% solids comprising 25 parts by dry weight of Vinol 325 and 75 parts by dry weight of Michem 4983 was coated on the MD-oriented coextruded film. The resultant film had a % haze of 1.3 and a gloss of 89.3.

EXAMPLE 3

An aqueous coating dispersion of 5% solids comprising 50 parts by dry weight of Vinyl 325 and 50 parts by dry weight of Michem 4983 was coated on the same MD-oriented, coextruded film as described in Example 1. The resultant film had a % haze of 1.1 and a gloss of 90.3.

EXAMPLE 4

An aqueous coating dispersion of 5% solids comprising 75 parts by dry weight of Vinyl 325 and 25 parts by dry weight of Michem 4983 was coated on the same MD-oriented, coextruded film as described in Example 1. The resultant film had a % haze of 1.3 and a gloss of 88.9.

EXAMPLE 5

In a manner similar to Example 1, an aqueous coating dispersion of 5% solids comprising 50 parts by dry weight of Vinol 125 (99.3+% super hydrolzyed polyvinyl alcohol, obtained from Air Products) and 50 parts by dry weight of Michem 4983 was coated on the MD-oriented coextruded film. The resultant coated film had a coating weight of 0.15 mg/sq. in. and good transparency.

EXAMPLE 6

In a manner similar to Example 1, an aqueous dispersion of 5% solids consisting of 50 parts by dry weight of Vinol 325 and 50 parts of dry weight of Michem 4983, and 5 parts by dry weight of Michem Lube 193 (No. 1 carnauba wax obtained from Michelman Corp.) was coated on the MD-oriented coextruded film. The resultant film had a coating weight of 0 16 mg/sq. in. and good transparency.

EXAMPLE 7

In a manner similar to Example 1, an aqueous coating dispersion of 5% solids consisting of 50 parts by dry weight of Vinol 125 and 50 parts by dry weight of Michem 4983, was coated on an MD-oriented PP homopolymer film (Fina 3378). The resultant film had good transparency and excellent barrier properties after it was metallized by aluminum.

In a manner similar to Example 1, an aqueous coating dispersion of 5% solids consisting of 50 parts by dry weight of Vinol 125 and 50 parts by dry weight of Michem 4983, 2.5 parts by dry weight of Cymel 373 (melamine-formaldehyde cross linker) and 1 part by dry weight of an ammonium salt of p-toluene sulfonic acid (catalyst) was coated on the same MD-oriented PP homopolymer. The resultant film had good transparency and excellent barrier properties after the film was metallized.

EXAMPLE 9

In a manner similar to Example 1, an aqueous coating dispersion of 5% solids consisting of 50 parts by dry weight of Vinol 325 and 50 parts by dry weight of Michem 4983, was coated on the same coextruded film except that the polypropylene skin layer was modified with 3% Epolene E-43 (a low MW polypropylene wax containing maleic anhydride functionality, obtained from Eastman Kodak). The resultant film had a coating weight of 0.15 mg/sq. in. and good transparency.

EXAMPLE 10

In a manner similar to Example 10, an aqueous coating dispersion of 5% solids consisting of 62 parts by dry weight of Vinol 325 and 38 parts by dry weight of Michem 4983 wa coated on the Epolene E-43 modified surface. The resultant film had a coating weight of 0.24 mg/sq. in. and good transparency.

EXAMPLE 11

In a manner similar to Example 10, an aqueous coating dispersion of 5% solids consisting of 75 parts by dry weight of Vinol 325 and 25 parts by dry weight of Michem 4983 was coated on the Epolene E-43 modified surface. The resultant film had good transparency. Its coating weight, however, could not be accurately measured.

COMPARATIVE EXAMPLE A

A control film example was prepared in a manner similar to Example 1 except that the aqueous coating was omitted. The homopolymer surface was treated with corona discharge to give a surface tension of 38 dynes/cm. The uncoated film had a percent haze of 1.5 and a gloss of 88.4.

COMPARATIVE EXAMPLE B

An additional control film sample was prepared in a manner similar to Example 1 except the coating was composed of 5% solids aqueous dispersion of Michem 4983. The resultant film had a percent haze of 1.5 and a gloss of 88.5.

COMPARATIVE EXAMPLE C

A further control film sample was prepared in a manner similar to Example 1 except that the coating was composed of 5% solids aqueous solution of Vinol 325.

All of the above examples were vacuum-deposited with aluminum employing techniques well known in the art. These films were compared in terms of (1) metal adhesion to the film surface and (2) barrier properties. The adhesion was evaluated by peeling off the coating using 610 Scotch tape. The barrier properties were characterized by oxygen transmission rate (OTR) and water vapor transmission rate (WVTR), using Ox-Tran 1050 A and Permatran-W, respectively. Both of these instruments were manufactured by Modern Controls, Inc. The results are shown in the following Table.

TABLE

| | | Metallized Film | | |
|---|---|---|---|---|
| Example | Blend Composition | Adhesion (1) | OTR (2) | WVTR (3) |
| 1 | 10/90 Vi.325/Mi.4983 | 10 | 7.1 | 0.16 |
| 2 | 25/75 Vi.325/Mi.4983 | 10 | 6.3 | 0.17 |
| 3 | 50/50 Vi.325/Mi.4983 | 9 | 1.3 | 0.06 |
| 4 | 75/25 Vi.325/Mi.4983 | 4 | 0.61 | 0.11 |
| 5 | 50/50 Vi.125/Mi.4983 | 10 | 1.2 | 0.03 |

TABLE-continued

| | | Metallized Film | | |
|---|---|---|---|---|
| Example | Blend Composition | Adhesion (1) | OTR (2) | WVTR (3) |
| 6 | 50/50 Vi.325/Mi.4983 +5% Michem 193 | 10 | 1.2 | 0.04 |
| 7 | 50/50 Vi.125/Mi.4983 | 10 | 0.32 | 0.005 |
| 8 | 50/50 Vi.125/Mi.4983 +2.5% Cymel 373 + 1% Ammonium salt of p-TSA | 10 | 0.20 | — |
| 9 | 50/50 Vi.325/Mi. 4983 | 10 | 1.2 | 0.04 |
| 10 | 62/38 Vi.325/Mi. 4983 | 10 | 0.78 | 0.07 |
| 11 | 75/25 Vi.325/Mi. 4983 | 10 | 0.66 | 0.08 |
| A | None | 8 | 15 | 0.11 |
| B | 0/100 Vi.325/Mi.4983 | 10 | 13 | 0.10 |
| C | 100/0 Vi.325/Mi.4983 | 0 | — | — |

(1) 10 = best (0% coating peel-off), 0 = worst (100% coating peel-off).
(2) Oxygen transmission rate, measured in cc/100 sq.in./24 hr. at 0% RH and 86° F.
(3) Water vapor transmission rate, measured in gm/100 sq.in./24 hr. at 100% RH and 100° F.

Although the present invention has been described with reference to preferred embodiments, it is to be understood that modifications and variations may be resorted to without departing from the spirit and scope of this invention. Such modifications and variation are considered to be within the perview and scope of the appended claims.

What is claimed is:

1. A metallized film combination comprising an oriented polymer substrate layer of polypropylene or a copolymer thereof which substrate is susceptible, in unmodified form, to transmitting oxygen and moisture, at least one surface of which having a layer of a blend of (a) a polyvinyl alcohol homo or copolymer and (b) an ethylene-acrylic acid copolymer; and the surface of said layer blend having a metal layer thereon.

2. The combination of claim 1 wherein the ratio of (a) to (b) if from 10:90 to 90:10.

3. The combination of claim 2 wherein said blend is a blend of (a) a member selected from the group consisting of polyvinyl alcohol and ethylene-vinyl alcohol copolymer and (b).

4. The film combination of claim 3 wherein said blend if of (a) polyvinyl alcohol and (b).

5. The film combination of claim 3 wherein one side of said polypropylene substrate has a heat-seal skin layer thereon.

6. The film combination of claim 5 wherein said heat-seal skin layer is a copolymer of ethylene and propylene or a terpolymer of ethylene, propylene and 1-butene.

7. The film combination of claim 3 wherein the other side of said polypropylene substrate is modified by a maleic anhydride grafted polypropylene homopolymer or copolymer.

8. A method of forming a metallized film combination comprising:
(a) providing a polymeric substrate layer of polypropylene or a copolymer thereof which substrate is susceptible, in its unmodified form, to transmitting oxygen and moisture;
(b) machine direction orienting said substrate layer;
(c) coating at least one side of said substrate layer with a blend of (1) a vinyl alcohol homopolymer or copolymer and (2) an ethylene-acrylic acid copolymer;
(d) transverse direction orienting the coated substrate; and
(e) depositing a metal layer on the surface of said blend.

* * * * *

UNITED STATES PATENT AND TRADEMARK OFFICE
CERTIFICATE OF CORRECTION

PATENT NO. : 5,192,620

DATED : March 9, 1993

INVENTOR(S) : Shaw-Chang Chu and James A. Johnson

It is certified that error appears in the above-identified patent and that said Letters Patent is hereby corrected as shown below:

Col. 6, line 36: "if" should be --is--.

Col. 4, line 54: --Example 8-- needs to be inserted.

Signed and Sealed this

Twenty-eighth Day of December, 1993

Attest:

BRUCE LEHMAN

Attesting Officer      Commissioner of Patents and Trademarks